(12) United States Patent　　(10) Patent No.: US 7,683,740 B2
Yoshizawa et al.　　(45) Date of Patent: Mar. 23, 2010

(54) ELECTRONIC COMPONENT AND METHOD FOR MANUFACTURING SAME

(75) Inventors: Toshiyuki Yoshizawa, Tokyo (JP); Masahiro Miyazaki, Tokyo (JP); Akira Furuya, Tokyo (JP); Masaomi Ishikura, Tokyo (JP); Hajime Kuwajima, Tokyo (JP)

(73) Assignee: TDK Corporation, Tokyo (JP)

( * ) Notice: Subject to any disclaimer, the term of this patent is extended or adjusted under 35 U.S.C. 154(b) by 139 days.

(21) Appl. No.: 11/878,452

(22) Filed: Jul. 24, 2007

(65) Prior Publication Data

US 2008/0023219 A1　Jan. 31, 2008

(30) Foreign Application Priority Data

Jul. 28, 2006　(JP) ............................. 2006-206365

(51) Int. Cl.
　　*H03H 7/01*　(2006.01)
(52) U.S. Cl. ....................................... 333/185; 333/175
(58) Field of Classification Search ................ 333/185, 333/140, 167, 175
　　See application file for complete search history.

(56) References Cited

U.S. PATENT DOCUMENTS

| 6,166,424 | A  | * | 12/2000 | Mikawa et al. ............... 257/535 |
| 6,444,920 | B1 |   | 9/2002  | Klee et al. |
| 6,590,473 | B1 | * | 7/2003  | Seo et al. ..................... 333/185 |
| 6,674,632 | B2 | * | 1/2004  | Kiewitt et al. ............. 361/306.2 |
| 6,975,186 | B2 | * | 12/2005 | Hirabayashi ................ 333/204 |
| 2002/0135440 | A1 | * | 9/2002 | Ryhanen et al. ............. 333/185 |
| 2007/0126529 | A1 | * | 6/2007 | Chen .......................... 333/185 |
| 2009/0108381 | A1 | * | 4/2009 | Buchwalter et al. ......... 257/415 |

FOREIGN PATENT DOCUMENTS

| JP | A 10-51257    | 2/1998 |
| JP | A 10-65476    | 3/1998 |
| JP | A 10-150337   | 6/1998 |
| JP | A 2000-223361 | 8/2000 |
| JP | A 2002-25864  | 1/2002 |

* cited by examiner

*Primary Examiner*—Robert Pascal
*Assistant Examiner*—Gerald Stevens
(74) *Attorney, Agent, or Firm*—Oliff & Berridge, PLC

(57) ABSTRACT

An electronic component having: a substrate, a lower conductor layer provided on the substrate; an inorganic dielectric film that covers the lower conductor layer; and an upper conductor layer having an upper electrode portion provided on the inorganic dielectric film. The lower conductor layer has a lower electrode portion that together with the upper electrode portion and the inorganic dielectric film constitutes a capacitor, and a coil portion that constitutes an inductor. The entire inorganic dielectric film is formed integrally, and the lower conductor layer is in contact only with the substrate, inorganic dielectric film, and upper conductor layer.

11 Claims, 12 Drawing Sheets

(a)

(b)

(a)

(b)

(c)

(a)

(b)

(c)

(a)

(b)

(c)

(a)

(b)

(c)

(a)

(b)

(a)

(b)

US 7,683,740 B2

ELECTRONIC COMPONENT AND METHOD FOR MANUFACTURING SAME

BACKGROUND OF THE INVENTION

1. Field of the Invention

The present invention relates to an electronic component having an LC circuit and to a method for manufacturing the electronic component.

2. Related Background Art

Thin-film electronic components manufactured by using thin film formation technology are used in electronic devices such as personal computers and cellular phones. Electronic components of an LC composite type having formed therein an LC circuit having a capacitor and an inductor is one of such thin-film electronic components. Electronic components of an LC composite type are used, for example, as low pass filters, high pass filters, band pass filters, trap filters that remove signals within a predetermined frequency range, or other LC filters.

A thin-film capacitor element in which a lower electrode, a dielectric layer, and an upper electrode are stacked in the order of description on a substrate has been suggested, this capacitor element having a configuration in which an insulator layer that covers a circumferential edge portion of the lower electrode is formed using a photosensitive resin, and the upper electrode is formed in an opening of the insulator layer (Japanese Patent Application Laid-open No. 2002-25864). Other documents relating to electronic components of an LC composite type include Japanese Patent Applications Laid-open No. 10-51257, 10-65476, 10-150337, and 2000-223361.

SUMMARY OF THE INVENTION

However, the inventors found that in the case where an organic insulating layer is in contact with a conductor layer such as a capacitor electrode portion in an electronic component of an LC composite type that has a capacitor and an inductor, when the electronic component is used as an LC filter, the filter characteristics tend to degrade easily. More specifically, for example, frequency selectivity of the LC filter after long-term use tends to decrease easily.

Accordingly, it is an object of the present invention to provide an electronic component of an LC composite type in which degradation of filter characteristics when the electronic component is used as an LC filter is inhibited. Another object of the present invention is to provide a manufacturing method that makes it possible to manufacture an electronic component of an LC composite type in which degradation of filter characteristics when the electronic component is used as an LC filter is inhibited.

The present invention provides an electronic component having a substrate, a lower conductor layer provided on the substrate, an inorganic dielectric film that covers the lower conductor layer, and an upper conductor layer having an upper electrode portion provided on the inorganic dielectric film. The lower conductor layer has a lower electrode portion that together with the upper electrode portion and the inorganic dielectric film constitutes a capacitor, and a coil portion that constitutes an inductor. The entire inorganic dielectric film is formed integrally, and the lower conductor layer is in contact only with the substrate, inorganic dielectric film, and upper conductor layer.

Alternatively, the present invention provides an electronic component comprising: a substrate, a lower conductor layer provided on the substrate, an inorganic dielectric film that covers the lower conductor layer, an organic insulating layer provided on a surface of the inorganic dielectric film on a side opposite to substrate and patterned to form an opening having the inorganic dielectric film as a bottom, and an upper conductor layer having an upper electrode portion provided on the inorganic dielectric film in the opening. The lower conductor layer has a lower electrode portion that together with the upper electrode portion and the inorganic dielectric film constitutes a capacitor, and a coil portion that constitutes an inductor. The entire inorganic dielectric film is formed integrally. The lower conductor layer and the organic insulating layer are separated from each other by the inorganic dielectric film. In this case as well, the lower conductor layer may contact only with the substrate, inorganic dielectric film, and upper conductor layer.

In the electronic component in accordance with the present invention, even when the organic insulating layer is provided, the organic insulating layer is separated by the inorganic dielectric film from the lower conductor layer. As a result, electromigration of metal components constituting the lower conductor layer into the organic insulating layer is prevented. Where such electromigration occurs, insulation resistance of the organic insulating layer decreases and leak current increases between the upper electrode and lower electrode constituting the capacitor and in the coil portion of the inductor. In the case of the electronic component in accordance with the present invention, separating the organic insulating layer and the lower conductor layer prevents such increase in leak current. As a result, when the electronic component is used as an LC filter, the degradation of filter characteristic is inhibited.

The present invention also provide a method for manufacturing an electronic component comprising the steps of: forming an inorganic dielectric film that covers a lower conductor layer provided on a substrate and forming an upper conductor layer having an upper electrode portion provided on the inorganic dielectric film, wherein the lower conductor layer has a lower electrode portion that together with the inorganic dielectric film and the upper electrode portion constitutes a capacitor, and a coil portion that constitutes an inductor, the lower electrode portion and the coil portion are formed integrally, the entire inorganic dielectric film is formed integrally, and the inorganic dielectric film and the upper conductor layer are formed so that the lower conductor layer is in contact only with the substrate, inorganic dielectric film, and upper conductor layer.

Alternatively, the present invention provides a method for manufacturing an electronic component comprising the steps of: forming an inorganic dielectric film that covers a lower conductor layer provided adjacently to a substrate, forming an organic insulating layer on a surface of the inorganic dielectric film on a side opposite to the lower conductor layer, the organic insulating layer being patterned to form an opening having the inorganic dielectric film as a bottom, and forming an upper conductor layer having an upper electrode portion formed adjacently to the inorganic dielectric film in the opening, wherein the inorganic dielectric film and the organic insulating layer are formed so that the lower conductor layer and the organic insulating layer are separated from each other by the inorganic dielectric film. In this case, too, the inorganic dielectric film and the upper electrode portion may be formed so that the lower conductor layer is in contact only with the substrate, inorganic dielectric film, and upper conductor layer.

With the electronic component in accordance with the present invention, an electronic component of an LC composite type can be manufactured such that when the electronic component is used as an LC filter, degradation of filter characteristics is inhibited.

In the case of the electronic component obtained by the method in accordance with the present invention, the inductor portion and the lower electrode portion of the lower conductor layer are formed integrally, and the inorganic dielectric film covering them is also formed integrally. As a result, the surface state of the lower conductor layer in the electronic component obtained is more uniform than in the case where the lower electrode portion and the inductor portion are formed separately and then connected. Further, in long-time use of the electronic component, surface roughness of the lower conductor layer tends to increase and fluctuation of the surface state also tends to increase, by in the case of the electronic component obtained by the method in accordance with the present invention, the fluctuation of surface state of the lower conductor layer is decreased by comparison with that obtained when the lower electrode portion and the inductor portion are formed separately and then connected. Thus, in terms of uniformity of surface roughness, the electronic component obtained by the method in accordance with the present invention is significantly different from an electronic component obtained by forming the lower electrode portion and the inductor portion separately and then connecting them. In the case of electronic components for high-frequency applications, an electric current easily flows in the surface portion of the conductor layer due to the so-called skin effect. Therefore, uniformity of surface roughness is very important. Where the uniformity of surface roughness is high, the current flow becomes more uniform. As a result, characteristics of electronic components are improved and fluctuation in quality between the electronic components can be inhibited. Such inhibition of fluctuation in characteristics becomes more important as electronic components are miniaturized.

The step of forming the organic insulating layer preferably includes the steps of: patterning a photosensitive resin layer formed on the inorganic dielectric film by exposure and development thereof, and heating the patterned photosensitive resin layer.

Using a photosensitive resin layer makes it possible to form a fine and highly accurate organic insulating layer with good efficiency at a low cost. Furthermore, an organic insulating layer that excels in heat resistance is formed by heating the patterned photosensitive resin layer.

Here, the lower conductor layer typically comprises a metal such as copper, and when a lower conductor layer comprising a metal is in contact with an organic insulating layer, if the lower conductor layer is exposed to a high temperature when the photosensitive resin layer is heated, the surface of the portion that is in contact with the organic insulating layer is sometimes significantly roughened. Roughening of the lower conductor layer surface tends to increase current loss. In the case of electronic components for high-frequency applications, an electric current flows easily in the surface portion of the conductor layer due to the so-called skin effect. Therefore, the effect of surface roughening on current loss increases.

By contrast, the inventors found that roughening of the lower conductor layer surface can be effectively inhibited by heating the photosensitive resin layer in coated by the inorganic dielectric film. Further, in the electronic component obtained, a state is assumed in which the lower conductor layer surface is uniformly covered with the inorganic dielectric layer. Therefore, surface roughness of the lower conductor layer is made more uniform and the fluctuation of surface roughness within one electronic component and between a plurality of electronic components can be inhibited.

The lower conductor layer preferably includes a copper plated layer formed by plating. In the case of a copper plated layer, increase in surface roughness easily occurs due to by electromigration and heating, and the application of the present invention is especially useful.

DESCRIPTION OF THE PREFERRED EMBODIMENTS

The preferred embodiments of the present invention will be described below in greater detail. However, the present invention is not limited to the below-described embodiments. Identical or equivalent components in the figures are in principle denoted with identical symbols.

Figure 1:
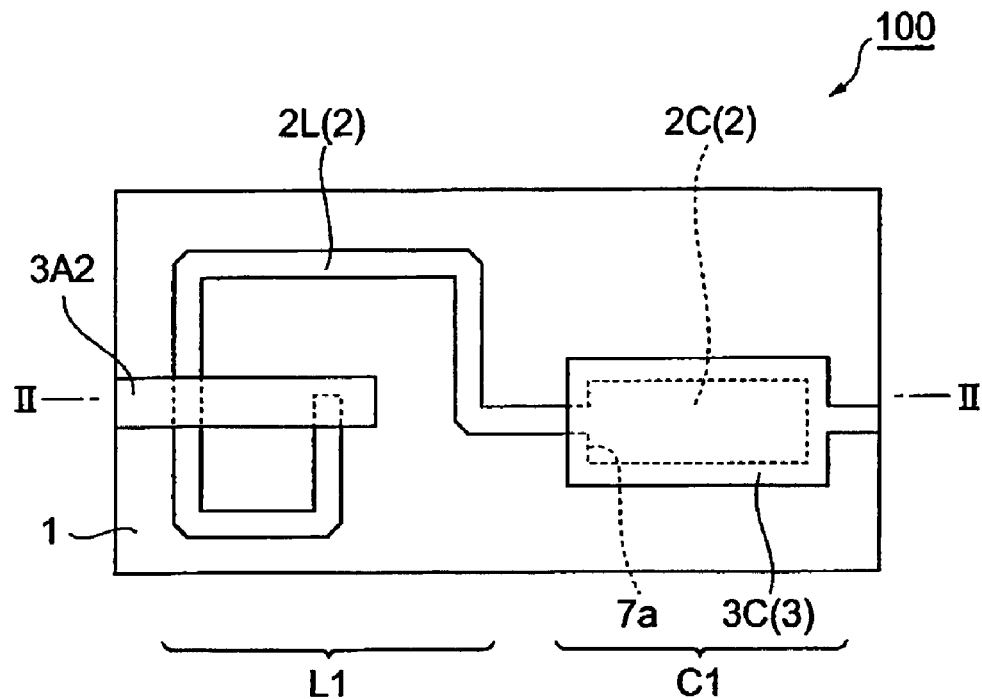
FIG. 1 is a plan view and an equivalent circuit diagram illustrating an embodiment of the electronic component in accordance with the present invention.
Figure 1:
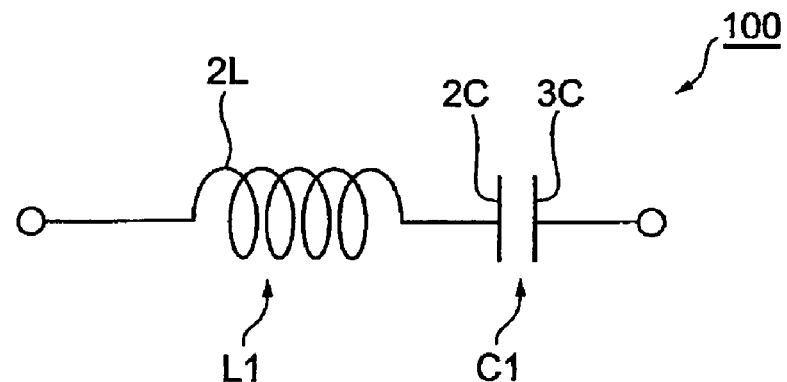
Figure 2:
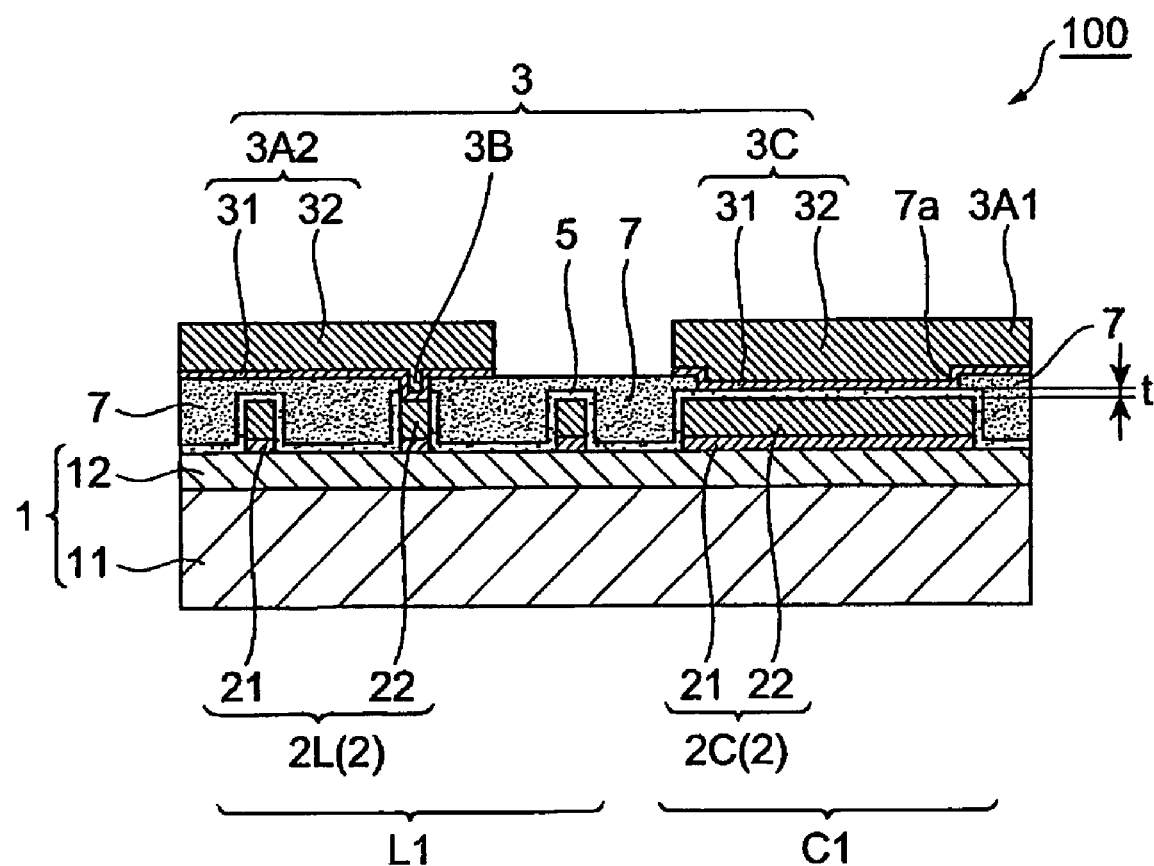
FIG. 2 is an end view along the II-II line in FIG. 1.

FIG. 1 is a plan view ((a) of FIG. 1) and an equivalent circuit diagram ((b) of FIG. 1) illustrating an embodiment of the electronic component in accordance with the present invention. FIG. 2 is an end view along the II-II line in (a) of FIG. 1.

An electronic component 100 shown in FIGS. 1, 2 comprises a substrate 1, a lower conductor layer 2 provided on the main surface of the substrate 1 adjacently to the substrate 1, an inorganic dielectric film 5 that covers the lower conductor layer 2, an organic insulating layer 7 provided on a surface of the inorganic dielectric film 5 on a side opposite to the substrate 1 and patterned to form an opening 7a having the inorganic dielectric film 5 as a bottom, and an upper conductor layer 3 formed on the surface of the laminate composed of the substrate 1, lower conductor layer 2, inorganic dielectric film 5, and organic insulating layer 7 on the side of the organic insulating layer 7. (a) of FIG. 1 shows configuration in which the inorganic dielectric film 5 and organic insulating layer 7 are omitted.

The organic insulating layer 7 and lower conductor layer 2 are disposed without mutual contact therebetween. Thus, the two are separated from each other by the inorganic dielectric film 5. In other words, in the lower conductor layer 2, the surface outside the portion that is in contact with a joining portion 3B is completely covered by the inorganic dielectric film 5 composed of a single phase, and the lower conductor layer 2 is in contact only with the substrate 1, inorganic dielectric film 5, and upper conductor layer 3.

The upper conductor layer 3 has an upper electrode portion 3C formed adjacently to the inorganic dielectric film 5 inside the opening 7a, a lead-out conductor portion 3A1 that is formed integrally with the upper electrode portion 3C and exposed at the end portion of the electronic component 100, a lead-out conductor portion 3A2 that is formed on the organic insulating layer 7 and exposed at the end portion of the electronic component 100, and the joining portion 3B that passes through the organic insulating layer 7 and inorganic dielectric film 5 and joins the lead-out conductor portion 3A2 and the lower conductor layer 2. The joining portion 3B is formed integrally with the lead-out conductor portion 3A2.

The upper conductor layer 3 is connected to the outside by the lead-out conductor portions 3A1 and 3A2. The upper conductor layer 3 may further have a coil portion that is patterned as a spiral on the organic insulating layer 7.

The lower conductor layer 2 has a lower electrode portion 2C that together with the upper electrode portion 3C and the inorganic dielectric film 5 constitutes a capacitor C1 and a coil portion 2L constituting an inductor L1. In other words, a portion of the lower conductor layer 2 that faces the upper electrode portion 3C is the lower electrode portion 2C, and the portion where the spiral coil pattern is formed is the coil portion 2L. The two are formed integrally. A series resonance circuit serving as an LC circuit is formed by the capacitor C1 comprising the lower electrode portion 2C, upper electrode portion 3C, and inorganic dielectric film 5 of the portion sandwiched therebetween and the inductor L1 comprising the coil portion 2L. Thus, the electronic component 100 is a thin-film electronic component of an LC composite type.

The lower conductor layer 2 includes a seed layer 21 formed adjacently to the substrate 1 and a plated layer 22 formed on the seed layer 21. The upper conductor layer 3 includes a seed layer 31 formed adjacently to the organic insulating layer 7, inorganic dielectric film 5 or lower conductor layer 3 and a plated layer 32 formed on the seed layer 31.

The plated layers 22, 32 are formed by electroplating on the seed layers 21, 31. The seed layers 21, 31 and plated layers 22, 32 are preferably formed from Cu, Ti, or alloys thereof. When the plated layer 22 is a copper plated layer comprising Cu, heating causes increase in surface roughness and electromigration easily occurs. Therefore, employing the electronic component having the configuration of the present embodiment is especially useful.

The substrate 1 comprises a base substrate 11 and a flattening film 12 formed on one surface of the base substrate 11. The base substrate 11 and flattening film 12 are formed, for example, from a ceramic such as alumina. The surface of the base substrate 11 opposite that where the flattening film 12 is formed, that is, the surface on the side where a thin-film member is formed is flattened by polishing or the like.

The inorganic dielectric film 5 is formed integrally as a whole so as to cover the entire surface of the lower conductor layer 2 and also to cover the surface of the substrate 1 on the side of the flattening film 12. An opening of a rectangular cross section having the end portion on the inner peripheral side of the coil portion 2L as a bottom is formed in the inorganic dielectric film 5, and the joining portion 3B and the lower conductor layer 2 are joined together in this opening. In the inorganic dielectric film 5, a portion covering the lower electrode portion 2C and a portion covering the coil portion 2L are formed integrally. As a result, an effect inhibiting the peeling of the lower electrode layer and inorganic dielectric film is also demonstrated. Furthermore, when the inorganic dielectric film 5 is formed integrally, it is comparatively easy to dispose the capacitor and the inductor close to each other, this being also advantageous from the standpoint of increasing the degree of integration of the electronic component. Because all the portions of the inorganic dielectric film can be formed together in a single process, rather than being formed separately, an advantage of simplifying the manufacturing process can be also obtained.

The thickness of inorganic dielectric film 5 (in particular, the thickness t of the surface opposite the substrate 1) is less than the thickness of the lower conductor layer 2. More specifically, the thickness t of the inorganic dielectric film 5 is preferably 10 to 1000 nm, more preferably 50 to 500 mm. Where the thickness is less than 10 nm, the insulating properties of the upper electrode portion 3C and lower electrode portion 2C are difficult to maintain, and where the thickness is more than 1000 nm, defects such as cracks or peeling tend to occur easily due to stresses in the dielectric film.

The inorganic dielectric film 5 preferably comprises at least one dielectric material selected from the group consisting of alumina, aluminum nitride, silica, silicon nitride, tantalum oxide, niobium oxide, titanium oxide, strontium titanate, barium strontium titanate, and lead zirconate titanate.

The organic insulating layer 7 is a layer comprising an insulating organic material patterned so that a predetermined opening is formed. The organic insulating layer 7 has a pattern having formed therein the opening 7a with the inorganic dielectric film 5 as a bottom and a through hole where the joining portion 3B is formed. The thickness of the organic insulating layer 7 is preferably several micrometers, more specifically 3 to 20 µm.

The organic insulating layer 7 typically is a resist pattern comprising a cured product of a photosensitive resin. A photosensitive polyimide can be advantageously used as the photosensitive resin because it excels in heat resistance.

FIGS. 3, 4, 5, and 6 are process diagrams illustrating by the end views an embodiment of the method for manufacturing the electronic component 100. The manufacturing method shown in FIGS. 3 to 6 comprises a step of forming the lower conductor layer 2 on the main surface of the substrate 1, this layer being adjacent to the substrate, a step of forming an inorganic dielectric film 5 that covers the lower conductor layer 2 provided adjacently to the substrate 1, a step of forming an organic insulating layer 7 on the surface of the inorganic dielectric film 5 on the side opposite that facing the substrate 1, the organic insulating layer being patterned so that the opening 7a having the inorganic dielectric film 5 as a bottom is formed therein, and a step of forming the upper conductor layer 3 having the upper electrode portion 3C formed adjacently to the inorganic dielectric film 5 inside the opening 7a.

Figure 3:
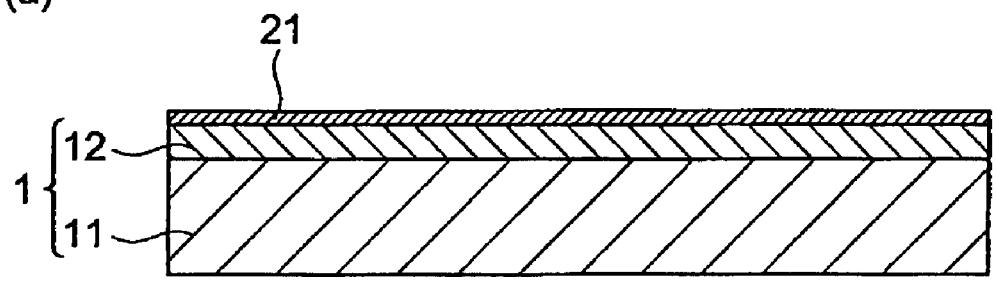
FIG. 3 is an end view illustrating an embodiment of the manufacturing method in accordance with the present invention.
Figure 3:
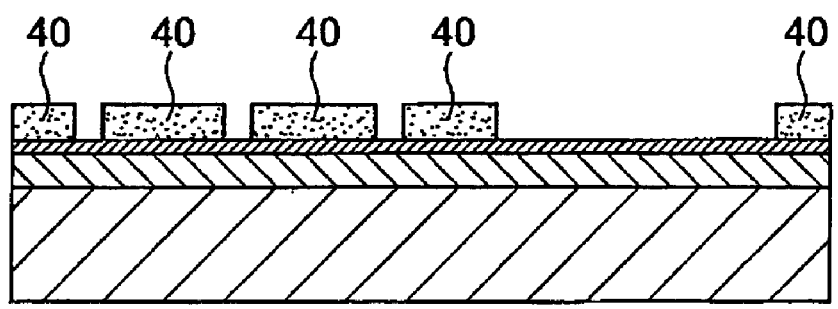
Figure 3:
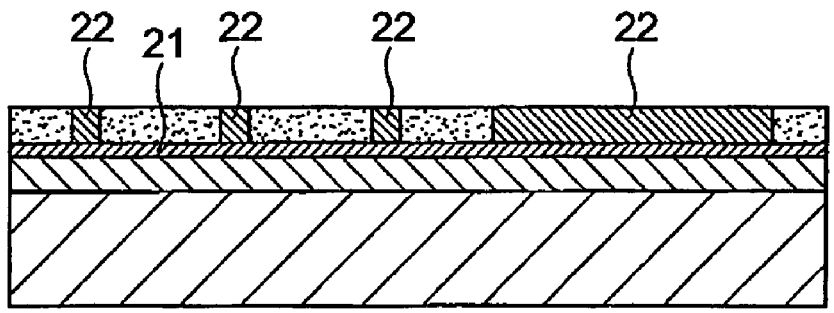

With the method of the present embodiment, first, the seed layer 21 is formed on the surface of the substrate 1 on the side of the flattening film 12 ((a) of FIG. 3). The substrate 1 is prepared by depositing the flattening film 12 by sputtering or the like on the base substrate 11 and then flattening the flattening film by polishing. The polishing can be performed by chemical-mechanical polishing or the like. The seed layer 21 has a structure in which a titanium layer with a thickness of about 30 nm and a Cu layer with a thickness of about 100 nm are laminated, and the layers are successively deposited by sputtering on the flattening film 12. Then, a resist pattern 40 is formed on the seed layer 21 by using a photosensitive resin ((b) of FIG. 3), and the plated layer 22 is formed by electroplating using the resist pattern 40 as a mask ((c) of FIG. 3).

Figure 4:
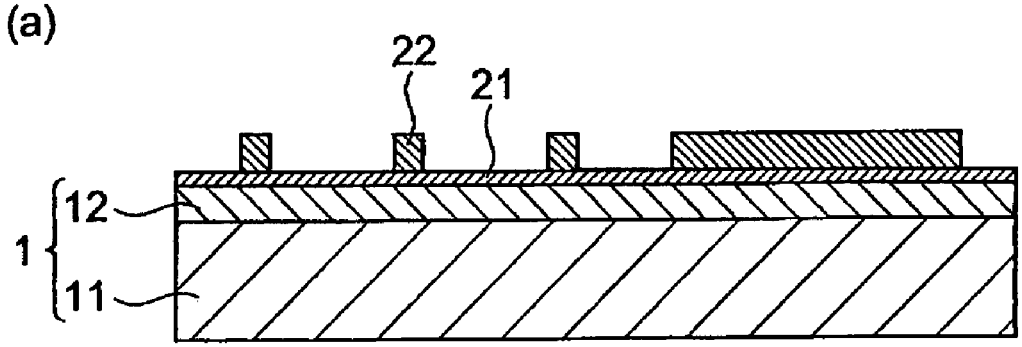
FIG. 4 is an end view illustrating an embodiment of the manufacturing method in accordance with the present invention.
Figure 4:
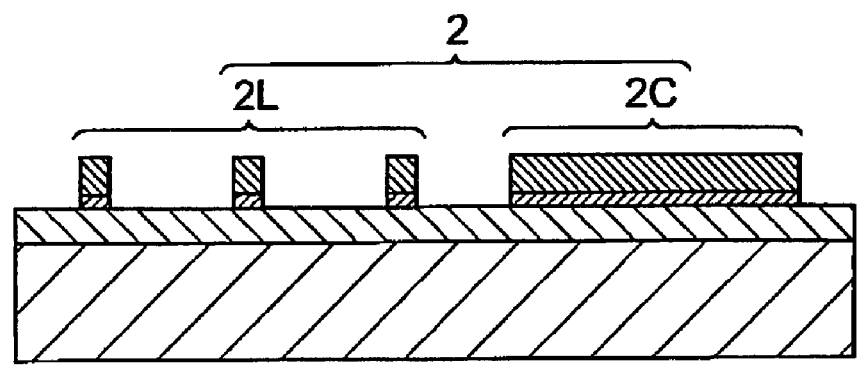
Figure 4:
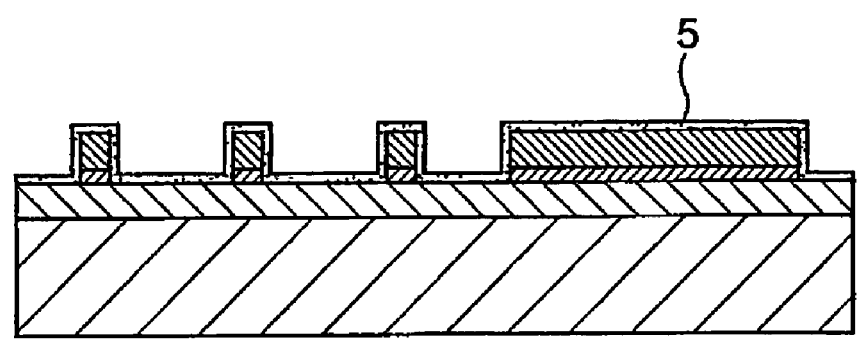

After the plated layer 22 has been formed, the resist pattern 40 is removed ((a) of FIG. 4). The seed layer 21 of the portion that has not been covered by the plated layer 22 is removed by dry etching or wet etching, and the lower conductor layer 2 having the coil portion 2L and the lower electrode portion 2C is formed ((b) of FIG. 4). Then the inorganic dielectric film 5 is integrally formed so as to cover the entire surface of the portion of the surface of the lower conductor layer 2 that is not in contact with the substrate 1 and so as to cover the surface of the substrate 1 that is at the side of flattening film 12 ((c) of FIG. 4). The inorganic dielectric film 5 is formed, for example, by a sputtering method or chemical vapor deposition.

Figure 5:
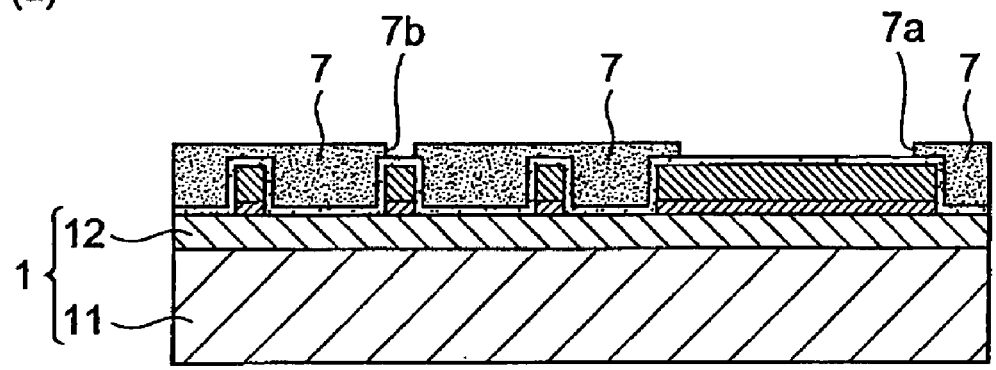
FIG. 5 is an end view illustrating an embodiment of the manufacturing method in accordance with the present invention.
Figure 5:
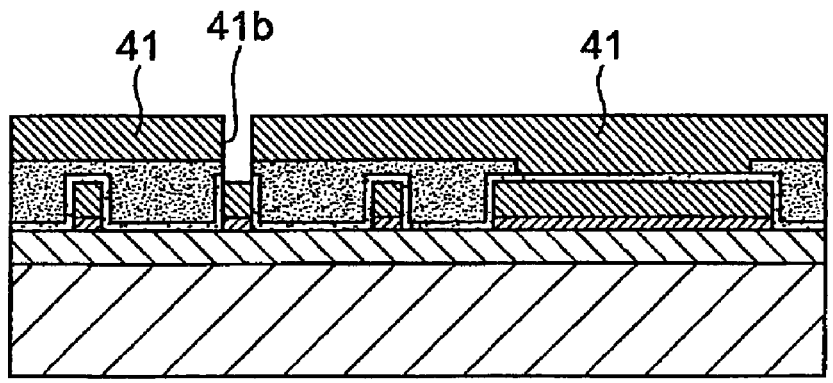
Figure 5:
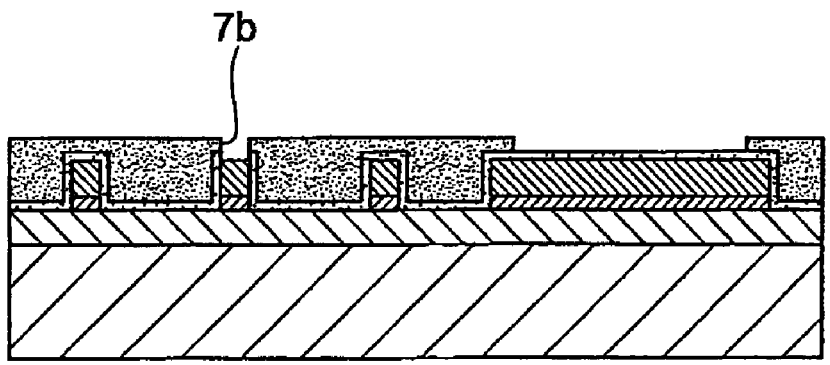
Figure 6:
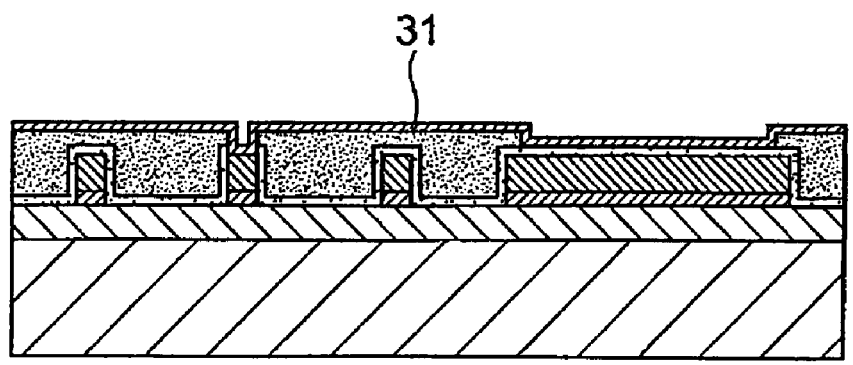
FIG. 6 is an end view illustrating an embodiment of the manufacturing method in accordance with the present invention.
Figure 6:
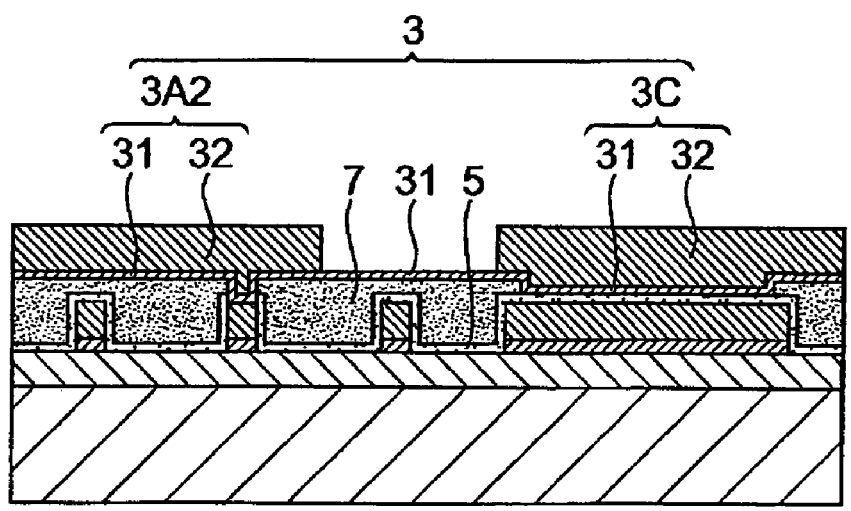
Figure 6:
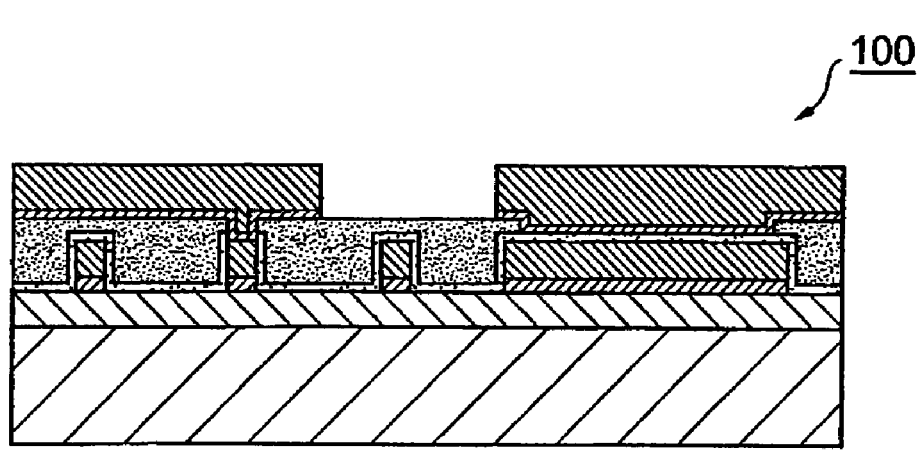

The organic insulating layer 7 is then formed that is patterned so that the opening 7a having the inorganic dielectric film 5 as the bottom is formed on the inorganic dielectric film 5 in a position where the upper electrode portion 3C will be formed, and the opening 7b is formed in a position where the joining portion 3B will be formed ((a) of FIG. 5). The organic insulating layer 7 is formed, for example, by a process comprising a step of forming a photosensitive resin layer on the inorganic dielectric film 5 and patterning this layer by pattern exposure and development and a step of heating the patterned photosensitive layer. The organic insulating layer 7 that excels in heat resistance is obtained by heating the photosensitive resin layer. By using the photosensitive resin, a very fine organic insulating layer 7 patterned with high accuracy can be manufactured at a low cost.

When a photosensitive polyimide is used as the photosensitive resin for forming the organic insulating layer 7, the temperature at which the photosensitive resin layer is heated is usually about 200 to 400° C. During this heating, roughening of the surface of the lower conductor layer 2 is inhibited because the surface of the lower conductor layer 2 is covered by the inorganic dielectric film 5. Where the plated layer 22 is heated to a temperature of 200 to 400° C. in a state of contact with the organic insulating layer, the surface roughness Ra thereof increases greatly due to crystal grain growth. Such increase in surface roughness is especially significant in the case of a copper plated layer. By contrast, the inventors have discovered that when heating is conducted in a state where the plated layer 22 is covered by the inorganic dielectric film 5, as in the present embodiment, such increase in surface roughness is inhibited. Further, the extent of changes in the surface roughness of the lower conductor layer caused by heating apparently depends on the type of material that is in contact with the surface, but where the inorganic dielectric film 5 is formed integrally, as in the present embodiment, the uniformity of surface roughness of the lower conductor layer after heating also increases. Uniform surface roughness inhibits fluctuation of properties in electronic components.

After the organic insulating layer 7 has been formed, a photosensitive resin is used to form a resist pattern 41 having a pattern formed by an opening 41b linked to the opening 7b, and part of the inorganic dielectric film 5 is then removed by etching using the resist pattern 41 as a mask ((b) of FIG. 5). The resist pattern 41 is then removed ((c) of FIG. 5). As a result, a state is assumed in which the lower conductor layer 2 is exposed in a position where the joining portion 3B will be formed.

The upper conductor layer 3 is then formed on the surface of the laminate comprising the substrate 1, lower conductor layer 2, inorganic dielectric film 5, and organic insulating layer 7 on the side of the organic insulating layer 7. The upper conductor layer 3 is formed by a method comprising the steps of forming the seed layer 31 by sputtering ((a) of FIG. 6) and forming the plated layer 32 on the seed layer 31 by electroplating ((b) of FIG. 6). The seed layer 31 of the portion that is not covered by the plated layer 32 is removed and the electronic component 100 is obtained ((c) of FIG. 6).

A protective film that covers the surface on the side of the upper conductor layer 3 may be also formed. Further, individual electronic components may be cut after forming a plurality of similar laminated structures on a single substrate.

Figure 7:
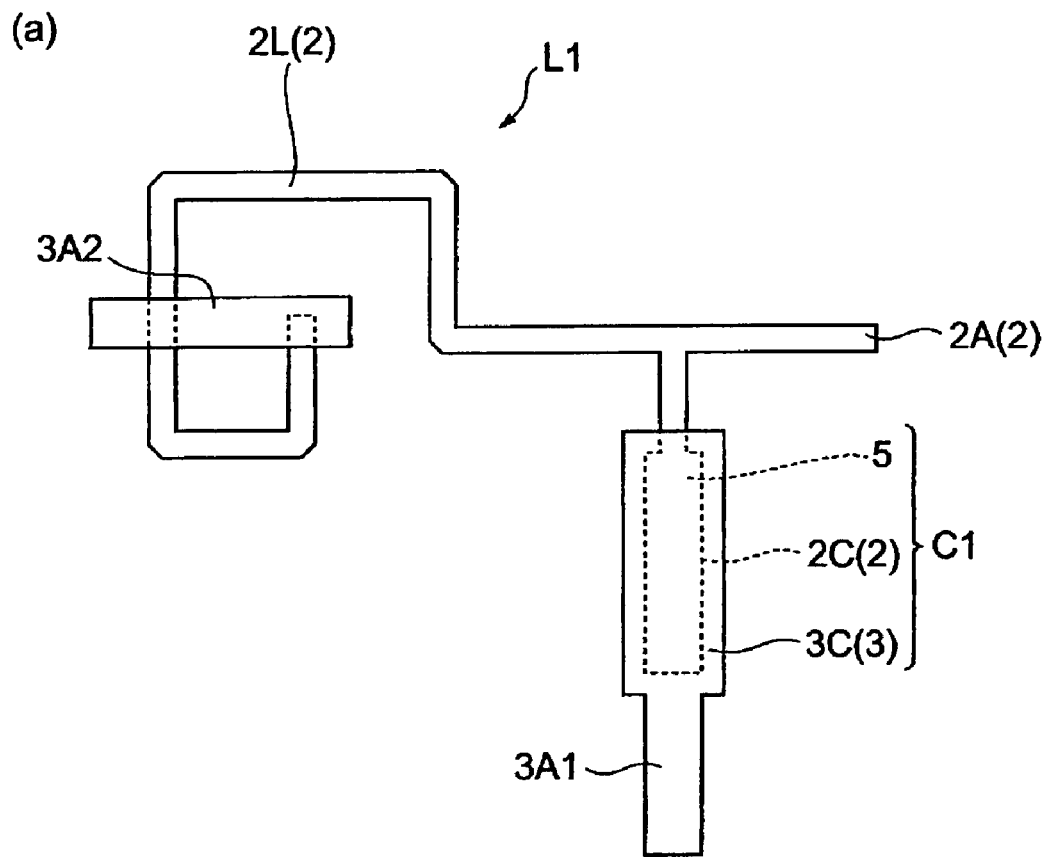
FIG. 7 is a plan view and an equivalent circuit diagram illustrating an embodiment of the electronic component in accordance with the present invention.
Figure 7:
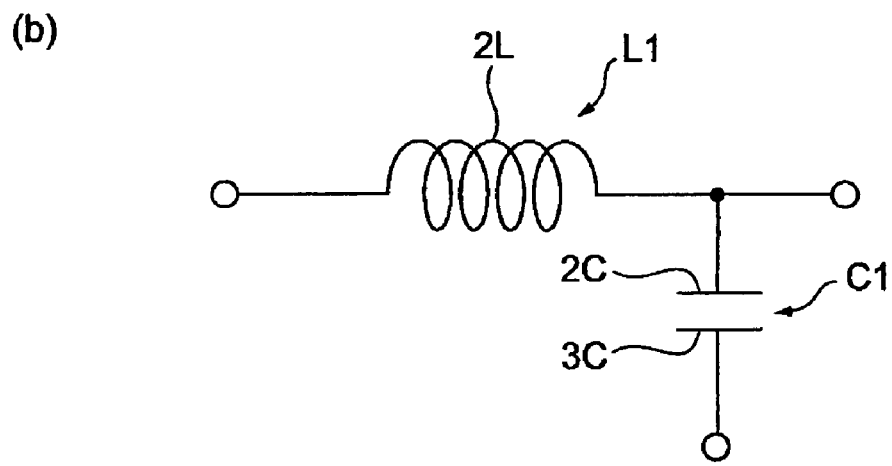
Figure 8:
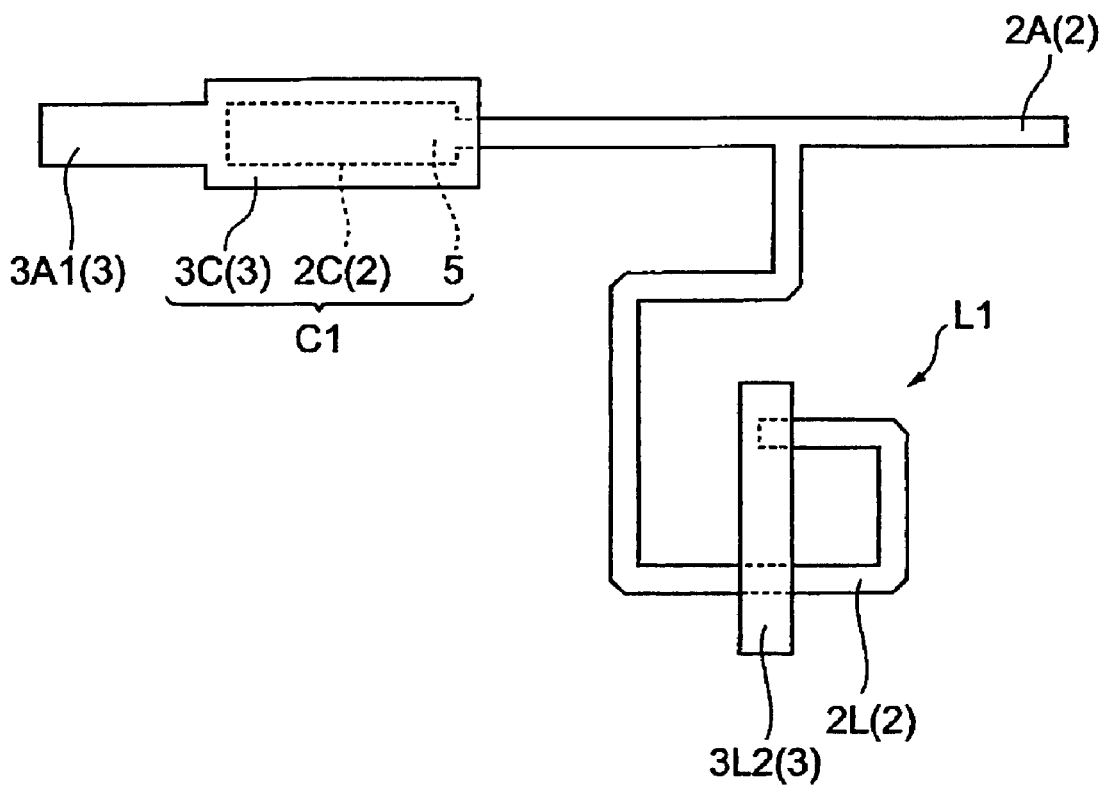
FIG. 8 is a plan view and an equivalent circuit diagram illustrating an embodiment of the electronic component in accordance with the present invention.
Figure 8:
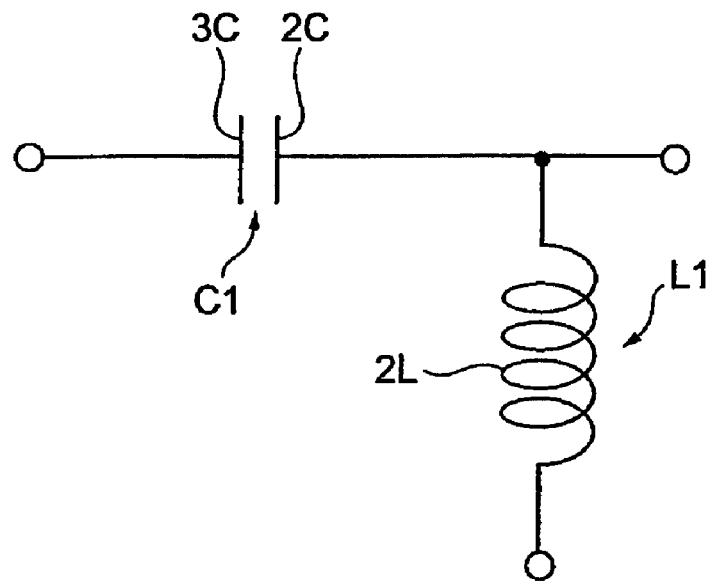

The present invention is not limited to the above-described embodiment. For example, when an electronic component is used as an LC filter, the lower conductor layer, upper conductor layer, inorganic dielectric film, and organic insulating layer are stacked so as to configure an LC circuit such as shown by the plan view ((a) of FIGS. 7 & 8) and equivalent circuit diagram ((b) of FIGS. 7 & 8) in FIGS. 7, 8. FIG. 7 shows an example of a low pass filter, and FIG. 8 shows an example of a high pass filter. In the case of electronic components shown in FIGS. 7, 8, the lower conductor layer 2 has the lead-out conductor portion 2A formed so as to enable exposure on the end portion of the electronic component in a position between the coil portion 2L and lower electrode portion 2C. Further, when the electronic component in accordance with the present invention is used as a band pass filter, the lower conductor layer, upper conductor layer, inorganic dielectric film, and organic insulating layer are stacked so as to configure, for example, the equivalent circuit diagram shown in FIG. 9. In the equivalent circuit diagram of FIG. 9, a portion in which the inductor L1 and capacitor C1 are connected in series and a portion where the inductor L2 and capacitor C2 are connected in parallel are formed. From the standpoint of improving filer characteristic, the electronic component in accordance with the present invention is especially useful when it is used as a band pass filter.

The effect of improving filter characteristics when the electronic component is used as an LC filter is examined by a simulation analysis.

Figure 10:
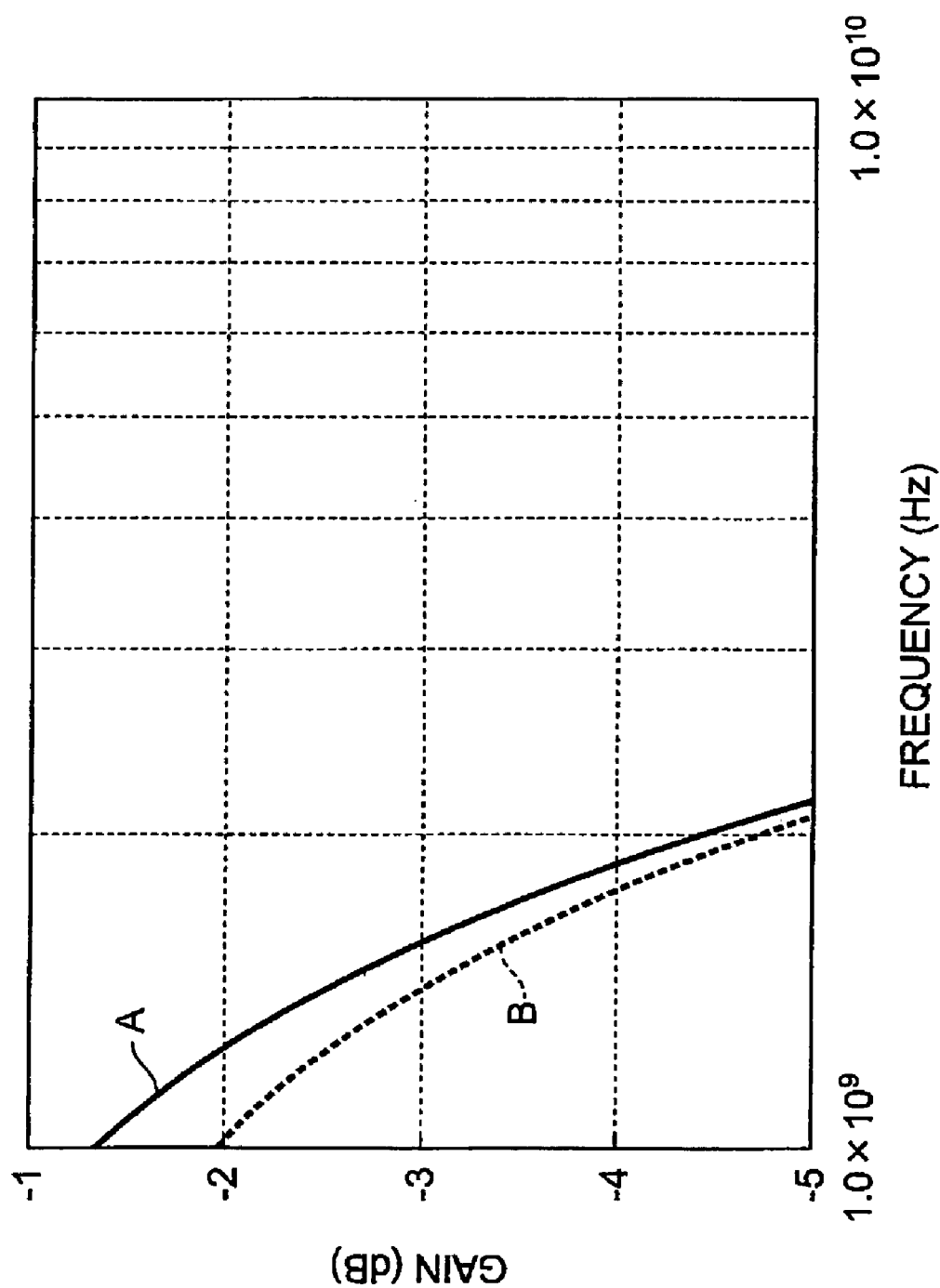
FIG. 10 is a graph illustrating a gain-frequency characteristic of a low pass filter.

FIG. 10 is a graph showing the calculation results on a gain-frequency characteristic of the low pass filter shown in FIG. 7. "A" in the figure stands for a gain-frequency characteristic obtained when an alternating voltage of 1 V is applied in the case where the inductance of the inductor L1 is 3.25 nH, the capacitance of capacitor C1 is 1.3 pF, and the circuit resistance is 100Ω. On the other hand, "B" denotes a corresponding gain-frequency characteristic obtained when an electric resistance between the lower electrode portion and upper electrode portion is 1000Ω and a leak current flows under the conditions identical to those of "A". In the "B" case in which leak current is generated, the gain in the frequency region in a range where transmission has to be attained tends to decrease with respect to that of case "A".

Figure 11:
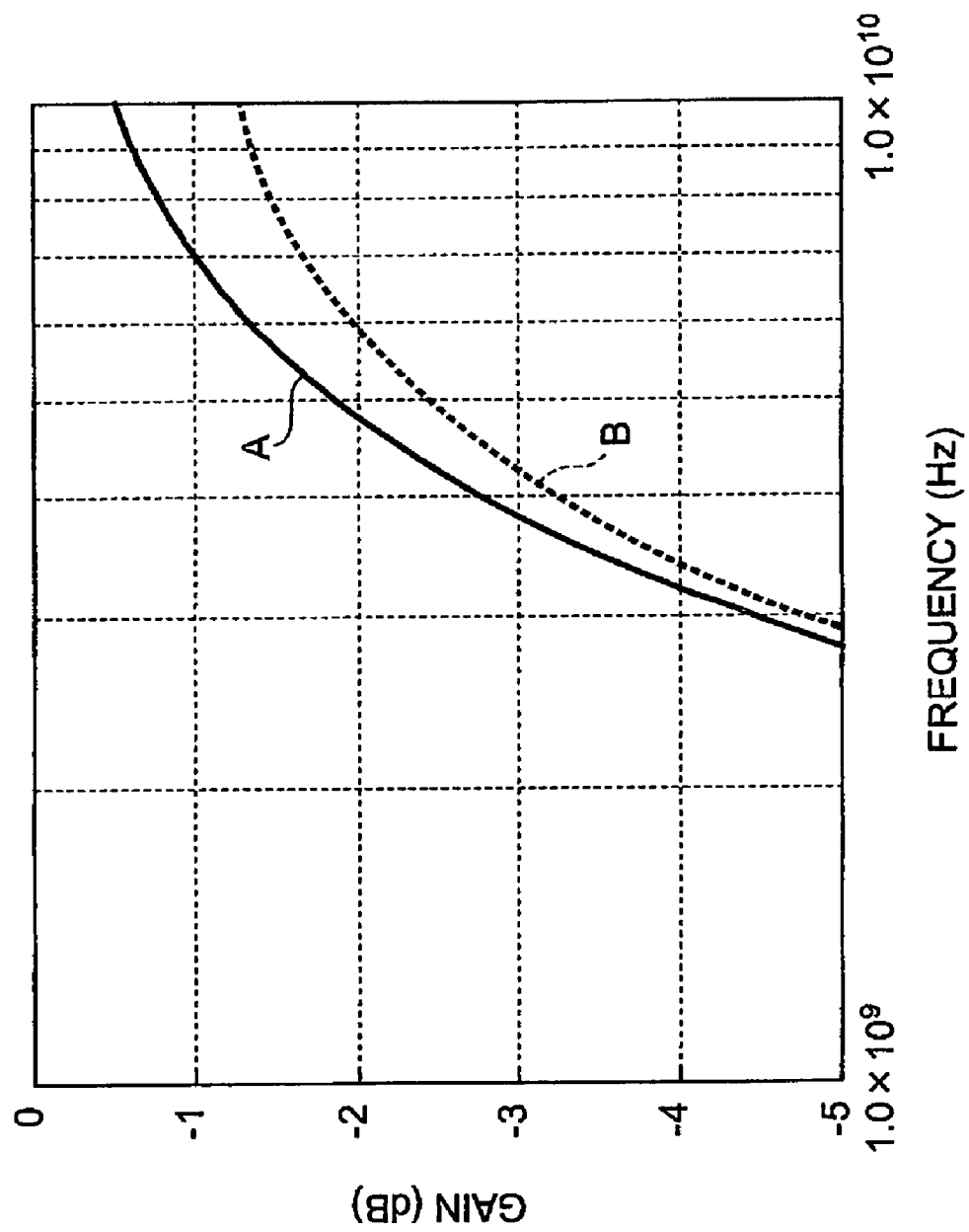
FIG. 11 is a graph illustrating a gain-frequency characteristic of a high pass filter.

FIG. 11 is a graph illustrating calculation results on a gain-frequency characteristic of a high pass filter shown in FIG. 8. "A" in the figure stands for a gain-frequency characteristic obtained when an alternating voltage of 1 V is applied in the case where the inductance of the inductor L1 is 3.25 nH, the capacitance of capacitor C1 is 1.3 pF, and the circuit resistance is 100Ω. On the other hand, "B" denotes a corresponding gain-frequency characteristic obtained when an electric resistance between the lower electrode portion and upper electrode portion is 1000Ω and a leak current flows under the conditions identical to those of "A". In the "B" case in which leak current is generated, the gain in the frequency region in a range where transmission has to be attained tends to decrease with respect to that of case "A".

Figure 9:
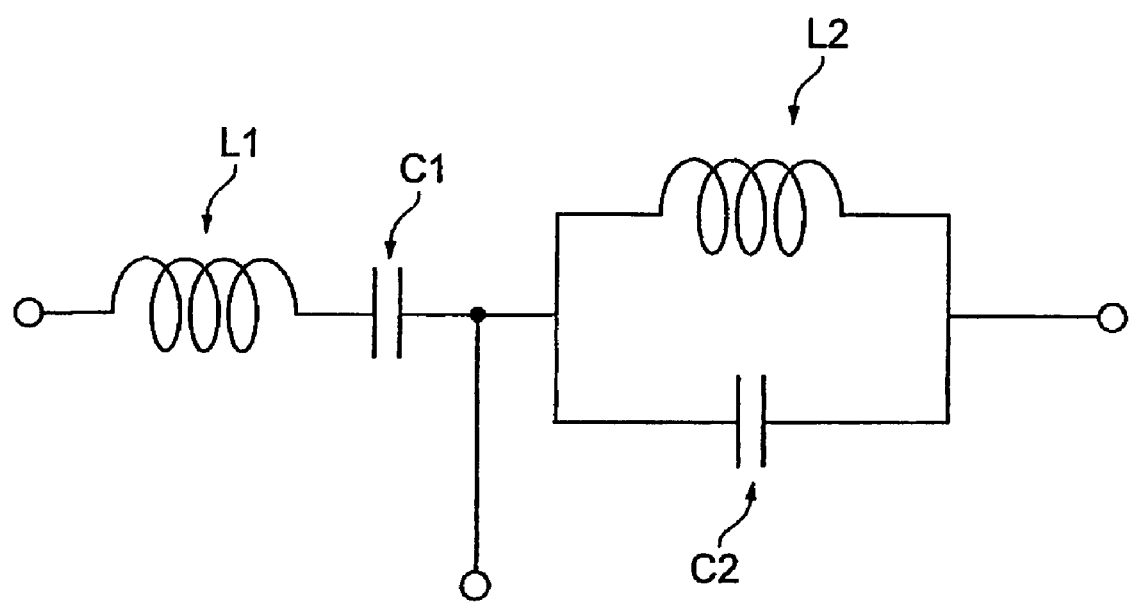
FIG. 9 is an equivalent circuit diagram illustrating an embodiment of an electronic component in accordance with the present invention.
Figure 12:
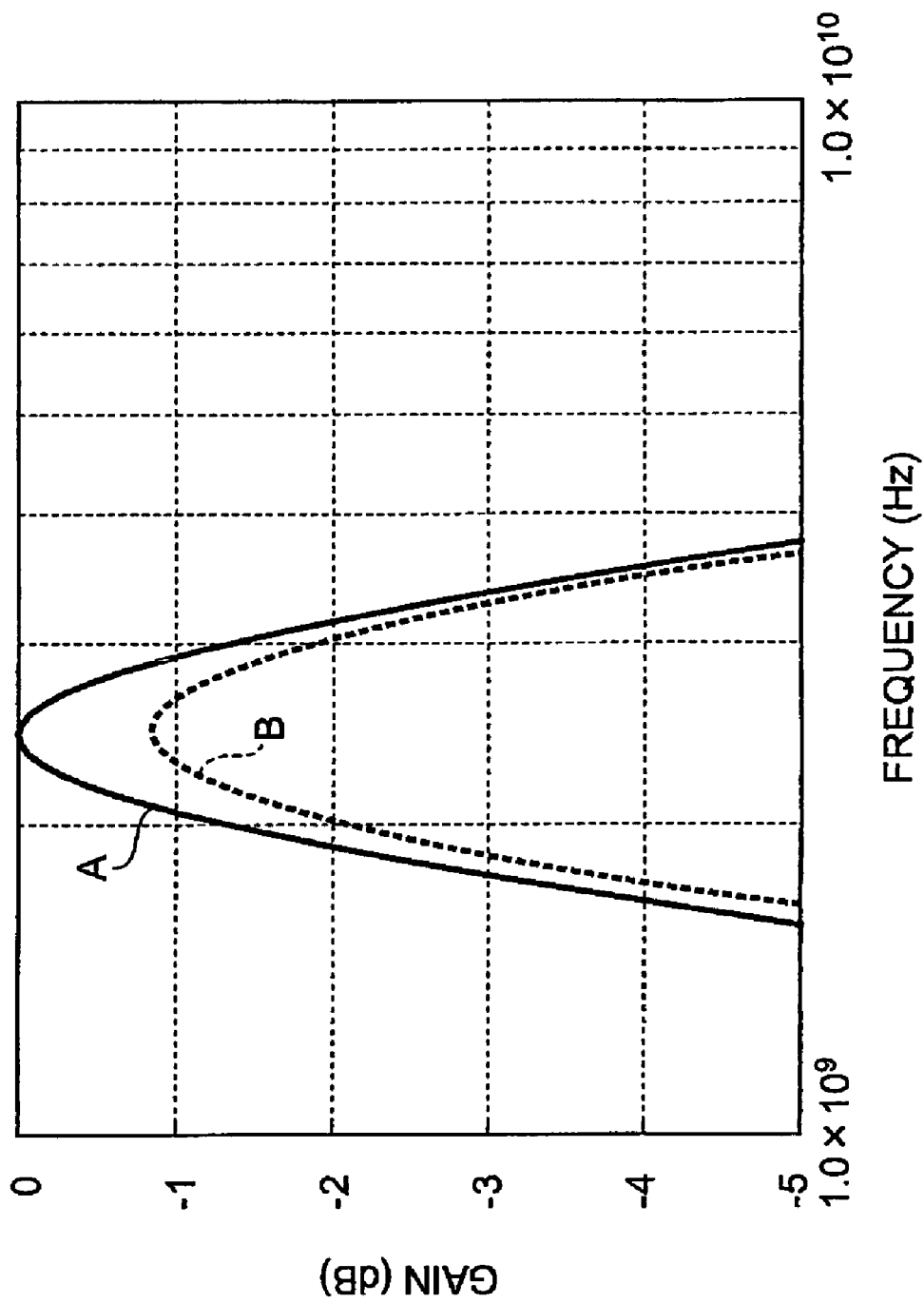
FIG. 12 is a graph illustrating a gain-frequency characteristic of a band pass filter.

FIG. 12 is a graph illustrating calculation results on a gain-frequency characteristic of a band pass filter shown in FIG. 9. "A" in the figure stands for a gain-frequency characteristic obtained when an alternating voltage of 1 V is applied in the case where the inductance of the inductors L1 and L2 is 3.25 nH, the capacitance of capacitors C1 and C2 is 1.3 pF, and the circuit resistance is 100Ω. On the other hand, "B" denotes a corresponding gain-frequency characteristic obtained when an electric resistance between the lower electrode portion and upper electrode portion is 1000Ω and a leak current flows under the conditions identical to those of "A". In the "B" case in which leak current is generated, the gain in the frequency region in a range where transmission has to be attained tends to decrease with respect to that of case "A".

The results of the aforementioned simulation analysis indicate that frequency selectivity in the LC filter decreases due to occurrence of leak current. Therefore, with the electronic component in accordance with the present invention in which the occurrence of leak current caused by electromigration to the organic insulating layer is inhibited, it will be possible to inhibit effectively degradation of filter characteristic observed when an LC filter is used.

The present invention provides an electronic component of an LC composite type in which degradation of filter characteristics when the electronic component is used as an LC filter is inhibited.

The present invention also provides a manufacturing method that makes it possible to manufacture an electronic component of an LC composite type in which degradation of filter characteristics when the electronic component is used as an LC filter is inhibited.

What is claimed is:

1. An electronic component comprising:
   a substrate;
   a lower conductor layer provided on said substrate;
   an inorganic dielectric film covering said lower conductor layer; and
   an upper conductor layer having an upper electrode portion provided on said inorganic dielectric film, wherein
   said lower conductor layer has a lower electrode portion that together with said upper electrode portion and said inorganic dielectric film constitutes a capacitor, and a coil portion that constitutes an inductor,
   an entirety of said inorganic dielectric film is formed integrally; and
   said lower conductor layer is in contact only with said substrate, said inorganic dielectric film, and said upper conductor layer, wherein
   the lower electrode portion and the coil portion are arranged in a lateral direction, and
   the lower electrode portion and the coil portion are buried in an organic insulating layer.

2. The electronic component according to claim 1, wherein said lower conductor layer includes a copper plated layer formed by plating.

3. The electronic component according to claim 2, wherein said inorganic dielectric film covers upper and side surfaces of the lower conductor layer and a surface of said substrate,
   said inorganic dielectric film has an opening arranged at a part of the upper surface of said coil portion of said lower conductor layer, and
   a lead-out conductor portion is provided on the inorganic dielectric film to contact with the coil portion of the lower conductor layer via said opening of said inorganic dielectric film.

4. The electronic component according to claim 1, being a band pass filter.

5. The electronic component according to claim 1, wherein said inorganic dielectric film covers upper and side surfaces of the lower conductor layer and a surface of said substrate,
   said inorganic dielectric film has an opening arranged at a part of the upper surface of said coil portion of said lower conductor layer, and
   a lead-out conductor portion is provided on the inorganic dielectric film to contact with the coil portion of the lower conductor layer via said opening of said inorganic dielectric film.

6. The electronic component according to claim 1, wherein said organic insulating layer is made of photosensitive polyimide.

7. An electronic component comprising:
   a substrate;
   a lower conductor layer provided on said substrate;
   an inorganic dielectric film covering said lower conductor layer; and
   an organic insulating layer provided on a surface of said inorganic dielectric film on a side opposite to said substrate and patterned to form an opening having said inorganic dielectric film as a bottom; and
   an upper conductor layer having an upper electrode portion provided on said inorganic dielectric film in said opening, wherein
   said lower conductor layer has a lower electrode portion that together with said upper electrode portion and said inorganic dielectric film constitutes a capacitor, and a coil portion that constitutes an inductor,
   an entirety of said inorganic dielectric film is formed integrally, and
   said lower conductor layer and said organic insulating layer are separated from each other by said inorganic dielectric film, wherein
   the lower electrode portion and the coil portion are arranged in a lateral direction, and
   the lower electrode portion and the coil portion are buried in the organic insulating layer.

8. The electronic component according to claim 7, wherein said lower conductor layer is in contact only with said substrate, said inorganic dielectric film and said upper conductor layer.

9. The electronic component according to claim 7, wherein said lower conductor layer includes a copper plated layer formed by plating.

10. The electronic component according to claim 7, being a band pass filter.

11. The electronic component according to claim 7, wherein
    said organic insulating layer is made of photosensitive polyimide.

* * * * *